(12) United States Patent
Kambe et al.

(10) Patent No.: US 11,488,335 B2
(45) Date of Patent: Nov. 1, 2022

(54) DRAWING MANAGEMENT APPARATUS, DRAWING MANAGEMENT SYSTEM, AND DRAWING MANAGEMENT METHOD

(71) Applicant: YOKOGAWA ELECTRIC CORPORATION, Musashino (JP)

(72) Inventors: Takahiro Kambe, Musashino (JP); Tatenobu Seki, Musashino (JP); Nobuaki Ema, Musashino (JP); Masato Annen, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/129,907

(22) Filed: Dec. 22, 2020

(65) Prior Publication Data

US 2021/0279924 A1    Sep. 9, 2021

(30) Foreign Application Priority Data

Mar. 6, 2020   (JP) .............................. JP2020-039172

(51) Int. Cl.
*G06T 11/20* (2006.01)
*G06Q 10/10* (2012.01)
*G06F 30/13* (2020.01)

(52) U.S. Cl.
CPC .......... *G06T 11/206* (2013.01); *G06Q 10/101* (2013.01); *G06F 30/13* (2020.01)

(58) Field of Classification Search
CPC ...... G06T 11/206; G06Q 10/101; G06F 30/15
See application file for complete search history.

(56) References Cited

U.S. PATENT DOCUMENTS

| 2005/0044518 | A1* | 2/2005 | Petunin | G06F 30/39 |
| | | | | 716/139 |
| 2016/0246899 | A1 | 8/2016 | Hirschtick et al. | |
| 2021/0096543 | A1* | 4/2021 | Stump | G06Q 10/06 |

FOREIGN PATENT DOCUMENTS

| EP | 3188049 A1 | 7/2017 |
| JP | 2017120632 A | 7/2017 |

OTHER PUBLICATIONS

H. Son et al., Knowledge-Based Approach for 3D Reconstruction of As-Built Industrial Plant Models From Laser-Scan Data, 2013 Proceedings of the 30th International Symposium on Automation and Robotics in Construction, Montreal, Canada, 2013.

* cited by examiner

*Primary Examiner* — Michelle L Sams
(74) *Attorney, Agent, or Firm* — Kenja IP Law PC

(57) ABSTRACT

A drawing management apparatus of the present disclosure includes a processor that generates a virtual plant based on various types of drawings of a plant, updates the virtual plant, when a change is made to a drawing among the various types of drawings, based on the change, and notifies a predetermined recipient, via a communication interface, of information related to a change made to the virtual plant by updating.

19 Claims, 5 Drawing Sheets

| | Master | | | | | Necessity of element/ reflection status | | |
|---|---|---|---|---|---|---|---|---|
| | VP1 | VP2 | Difference | Device ID | Pipe number | Drawing A | Drawing B ★ | Drawing C |
| Tank | ✓ | ✓ | No | T1001 | L100 | ✓ | ✓ | ✓ |
| M-Valve | | ✓ | Yes | MV501 | L100 | − | ✓ | × |
| C-Valve | ✓ | ✓ | No | CV201 | L100 | ✓ | ✓ | ✓ |
| Tank | ✓ | ✓ | No | T1002 | L100 | ✓ | ✓ | ✓ |
| C-Valve | ✓ | ✓ | No | CV202 | L100 | ✓ | ✓ | ✓ |
| Reactor | ✓ | ✓ | No | R101 | L100 | ✓ | ✓ | ✓ |
| C-Valve | | ✓ | Yes | CV203 | L100 | ✓ | ✓ | × |

Note 1: "✓" indicates a reflected element, and "×" indicates a non-reflected element.
Note 2: "−" indicates an unnecessary element.
Note 3: "★" indicates the drawing that triggered the VP update.
Note 4: The notation (symbols) are only non-limiting examples.

FIG. 4

| | Main instrumentation | Other instrumentation | Control valve | Manual valve | Piping | Layout information |
|---|---|---|---|---|---|---|
| Drawing A (PFD) | ○ | × | ○ | × | × | × |
| Drawing B (P&ID) | ○ | ○ | ○ | ○ | ○ | × |
| Drawing C (3D model) | ○ | ○ | ○ | ○ | ○ | ○ |

Note: "○" indicates a necessary element, and "×" indicates an unnecessary element.

FIG. 5

| | VP1 | VP2 | Master Difference | Device ID | Pipe number | Necessity of element/ reflection status Drawing A | Drawing B | Drawing C |
|---|---|---|---|---|---|---|---|---|
| Tank | ✓ | ✓ | No | T1001 | L100 | ✓ | ★ | ✓ |
| M-Valve | | ✓ | Yes | MV501 | L100 | – | ✓ | × |
| C-Valve | ✓ | ✓ | No | CV201 | L100 | ✓ | ✓ | ✓ |
| Tank | ✓ | ✓ | No | T1002 | L100 | ✓ | ✓ | ✓ |
| C-Valve | ✓ | ✓ | No | CV202 | L100 | ✓ | ✓ | ✓ |
| Reactor | ✓ | ✓ | No | R101 | L100 | ✓ | ✓ | ✓ |
| C-Valve | | ✓ | Yes | CV203 | L100 | ✓ | ✓ | × |

Note 1: "✓" indicates a reflected element, and "×" indicates a non-reflected element.
Note 2: "–" indicates an unnecessary element.
Note 3: "★" indicates the drawing that triggered the VP update.
Note 4: The notation (symbols) are only non-limiting examples.

DRAWING MANAGEMENT APPARATUS, DRAWING MANAGEMENT SYSTEM, AND DRAWING MANAGEMENT METHOD

CROSS REFERENCE TO RELATED APPLICATION

This application claims priority to and the benefit of Japanese Patent Application No. 2020-39172 (filed on Mar. 6, 2020), the entire contents of which are incorporated herein by reference.

TECHNICAL FIELD

The present disclosure relates to a drawing management apparatus, a drawing management system, and a drawing management method.

BACKGROUND

As a method for identifying objects, such as a pump, from 3D data of a plant, patent literature (PTL) 1, for example, discloses a method for generating 2D data from 3D data, acquired by scanning the outline of the plant, and comparing the 2D data with known 2D data to identify unknown objects.

CITATION LIST

Patent Literature

PTL 1: JP 2017-120632 A

SUMMARY

A drawing management apparatus according to an embodiment includes a processor and a communication interface. The processor is configured to generate a virtual plant based on various types of drawings of a plant; update the virtual plant, when a change is made to a drawing among the various types of drawings, based on the change; and notify a predetermined recipient, via the communication interface, of information related to a change made to the virtual plant by updating.

A drawing management system according to an embodiment includes the aforementioned drawing management apparatus and at least one terminal apparatus capable of communicating with the aforementioned drawing management apparatus.

A drawing management method according to an embodiment is a drawing management method using a computer and includes generating a virtual plant based on various types of drawings of a plant; updating the virtual plant, when a change is made to a drawing among the various types of drawings, based on the change; and notifying a predetermined recipient of information related to a change made to the virtual plant by updating.

BRIEF DESCRIPTION OF THE DRAWINGS

In the accompanying drawings:

FIG. 4 illustrates an overview of a data table in the second processing example; and FIG. 5 illustrates an overview of information related to a virtual plant in the second processing example.

DETAILED DESCRIPTION

Figure 1:
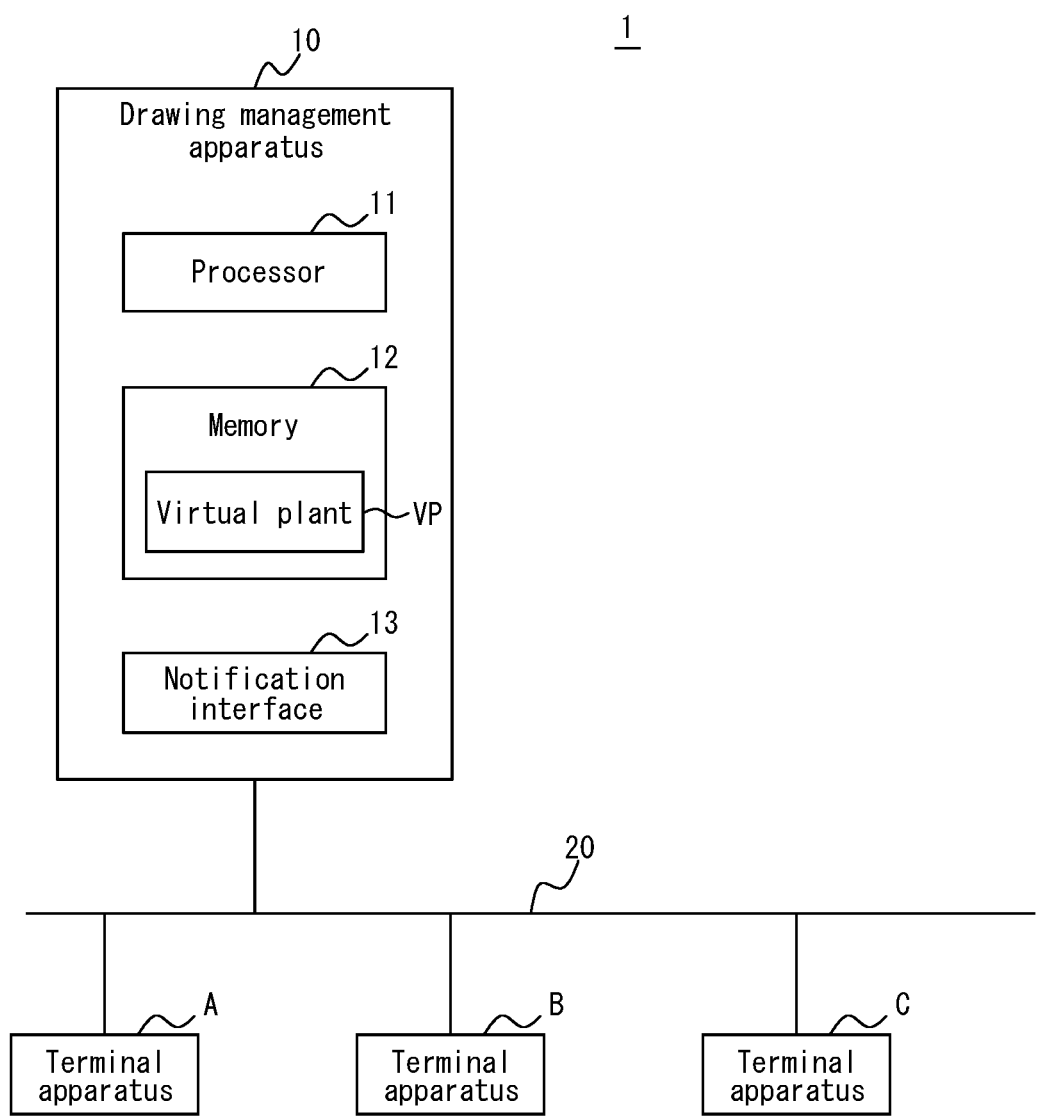
FIG. 1 is a functional block diagram illustrating the configuration of a drawing management system according to an embodiment.

As for a method for generating 2D data from 3D data, acquired by scanning the outline of the plant, and comparing the 2D data with known 2D data to identify unknown objects, it is assumed that the known 2D data is the latest data. Unknown objects therefore cannot be identified when the known 2D data is not the latest data. Various types of diagrams are used for plant design and the like, such as a process flow diagram (PFD), a piping and instrument diagram (P & ID) that provides details on the PFD, and a 3D piping diagram (3D plant diagram) that includes physical information on the P & ID. When corrections or the like need to be made to one of these diagrams, such as the PFD, the changes also need to be reflected in the P & ID and the 3D piping diagram. Tasks such as correcting drawings may, however, be divided up among a plurality of employees in charge in the plant. The task of reflecting corrections may therefore be neglected, or the content of the corrections forgotten, for reasons such as the employee in charge changing or being too busy. Consequently, consistency across various types of drawings, and hence consistency between the drawings and the actual plant, might not be secured. In particular, if a P & ID, 3D piping diagram, and the like are created based on a PFD or other drawing that is not consistent with the actual state of the plant, the inconsistent portion included in the drawing spreads to other drawings. Consistency across various types of drawings, and hence consistency between the drawings and the actual plant, is even less secure.

It would therefore be helpful to provide a drawing management apparatus, a drawing management system, and a drawing management method capable of securing consistency between various types of drawings, and hence consistency between the drawings and an actual plant.

A drawing management apparatus according to an embodiment includes a processor and a communication interface. The processor is configured to generate a virtual plant based on various types of drawings of a plant; update the virtual plant, when a change is made to a drawing among the various types of drawings, based on the change; and notify a predetermined recipient, via the communication interface, of information related to a change made to the virtual plant by updating.

With this configuration, consistency between various types of drawings, and hence consistency between the drawings and an actual plant, can be secured.

In an embodiment, the processor may be configured to perform verification of whether an element changed at a time of updating of the virtual plant is an element needing to be listed in the various types of drawings at the time of updating and include a result of the verification in the information related to the change made to the virtual plant by updating.

In this way, each employee can efficiently learn whether, due to updating of the virtual plant, changes need to be made to the drawings of which the employee is in charge. Reflection of changes is therefore less likely to be omitted, and work efficiency increases.

In an embodiment, the processor may be configured to perform verification of whether an element changed at a time of updating of the virtual plant is reflected in the various types of drawings at the time of updating and include a result of the verification in the information related to the change made to the virtual plant by updating.

In this way, each employee can efficiently learn whether, due to updating of the virtual plant, changes need to be made to the drawings of which the employee is in charge. Reflection of changes is therefore less likely to be omitted, and work efficiency increases.

In an embodiment, the processor may be configured to perform the verification on various types of drawings other than the drawing changed at the time of updating.

The verification can therefore be performed even more efficiently.

A drawing management system according to an embodiment includes the aforementioned drawing management apparatus and at least one terminal apparatus capable of communicating with the aforementioned drawing management apparatus.

With this configuration, consistency between various types of drawings, and hence consistency between the drawings and an actual plant, can be secured.

A drawing management method according to an embodiment is a drawing management method using a computer and includes generating a virtual plant based on various types of drawings of a plant; updating the virtual plant, when a change is made to a drawing among the various types of drawings, based on the change; and notifying a predetermined recipient of information related to a change made to the virtual plant by updating.

With this configuration, consistency between various types of drawings, and hence consistency between the drawings and an actual plant, can be secured.

According to the present disclosure, a drawing management apparatus, a drawing management system, and a drawing management method capable of securing consistency between various types of drawings, and hence consistency between the drawings and an actual plant, can be provided.

Embodiments of the present disclosure are described below with reference to the drawings. Identical reference signs in the drawings indicate identical or equivalent constituent elements.

Drawing Management System

A configuration of a drawing management system 1 according to the present embodiment is described with reference to FIG. 1.

The drawing management system 1 includes a drawing management apparatus 10, a terminal apparatus A corresponding to the first terminal apparatus, a terminal apparatus B corresponding to the second terminal apparatus, and a terminal apparatus C corresponding to the third terminal apparatus. The drawing management apparatus 10 can communicate with the terminal apparatus A, the terminal apparatus B, and the terminal apparatus C via a network 20, such as the Internet. The number of terminal apparatuses is not limited to three and may be any number.

The drawing management apparatus 10 is a computer, such as a personal computer (PC) or a server connected to a cloud computing system or the like, but is not limited to these examples.

The drawing management apparatus 10 includes a processor 11, a memory 12, and a communication interface 13.

The processor 11 includes one or more processors. The processor may, for example, be a general-purpose processor, such as a central processing unit (CPU), or a dedicated processor specialized for particular processing. The processor 11 performs processing related to the operation of the drawing management apparatus 10 while controlling each component of the drawing management apparatus 10.

The memory 12 includes one or more semiconductor memories, one or more magnetic memories, one or more optical memories, or a combination of these. The semiconductor memory is, for example, random access memory (RAM) or read only memory (ROM). Information used in operations of the drawing management apparatus 10 and information acquired by operations of the drawing management apparatus 10 are stored in the memory 12. For example, in addition to various types of drawings of an actual plant and information related to a virtual plant VP, the memory 12 may also store information related to expression rules, comparison rules, results of comparison, registration history, and notification history. Information related to terminal apparatuses A through C to be notified, the address of each employee in charge, work responsibilities, or the like can also be stored in the memory 12.

The communication interface 13 includes one or more communication interfaces capable, for example, of communicating over the Internet, a gateway, a local area network (LAN), or the like. The communication interface 13 receives information used in operations of the drawing management apparatus 10 and transmits information acquired by operations of the drawing management apparatus 10.

The operations of the drawing management apparatus 10 are implemented by a processor included in the processor 11 executing a program stored in the memory 12. The program may be stored on a non-transitory computer-readable medium.

The terminal apparatuses A, B, C are, for example, a mobile phone, smartphone, tablet, or PC or other computer, but these examples are not limiting. The terminal apparatuses A, B, C have applications or the like necessary for management of the various types of drawings of the actual plant installed thereon as appropriate and are used by parties involved with the various types of drawings. The parties involved with the various types of drawings are not limited to the employees in charge who handle the various types of drawings and may also include a drawing supervisor or a correction group leader for the various types of drawings, a manager of a plurality of drawings or of the entire plant, and the like.

In addition to an industrial plant such as a chemical plant, examples of the actual plant include a plant for managing a well site, such as a gas field or oil field, and the surrounding area. Additional examples of the actual plant may include a plant for managing power generation such as water power, thermal power, nuclear power, or the like; a plant for managing environmental power generation such as solar power, wind power, or the like; and a plant for managing water and sewage, a dam, or the like.

In the above-described configuration, a portion or all of the processing of the memory 12 in the drawing management apparatus 10 may be carried out by an external memory device capable of communicating with the drawing management apparatus 10 and the terminal apparatuses A, B, C. In addition to the above-described configuration, the drawing management system 1 may include any appropriate 3D scanning apparatus capable of scanning the outline of the actual plant in 3D and any appropriate terminal apparatus capable of communicating with the 3D scanning apparatus.

The drawing management system 1 may also include any appropriate terminal apparatus capable of managing the system overall.

First Processing Example

Figure 2:
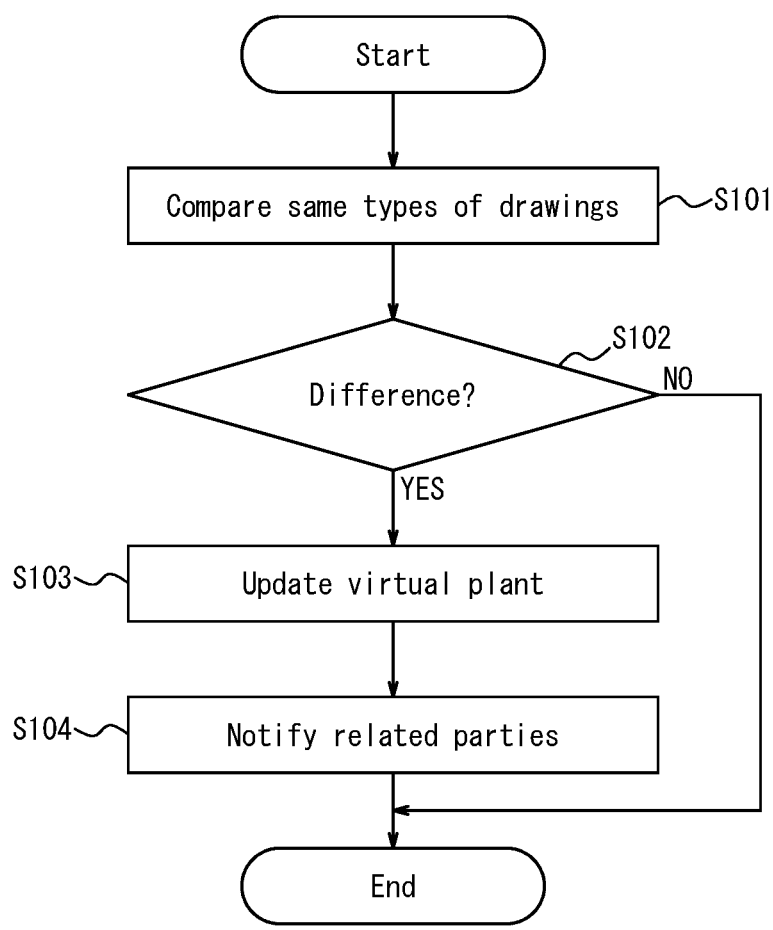
FIG. 2 is a flowchart illustrating a first processing example in the drawing management system according to an embodiment.

A first processing example of the drawing management system 1 according to the present embodiment is described with reference to FIG. 2. The first processing example corresponds to an embodiment of a drawing management method according to the present disclosure.

First, a drawing A1 created by employee in charge A, a drawing B1 created by employee in charge B, and a drawing C1 created by employee in charge C are assumed to be registered in advance in the memory 12 of the drawing management apparatus 10. In the present example, the drawing A1 is a process flow diagram (PFD). The drawing B1 is a piping and instrument diagram (P & ID). The drawing C1 is a 3D piping diagram. The drawing A1, drawing B1, and drawing C1 may be registered in any order, and the types of the drawing A1, drawing B1, and drawing C1 are not limited to PFD, P & ID, and 3D piping diagram. The processor 11 of the drawing management apparatus 10 generates a virtual plant VP1 based on the drawing A1, drawing B1, and drawing C1 acquired from the memory 12 and stores the virtual plant VP1 in the memory 12. For example, the processor 11 uses any appropriate method to extract the elements, such as valves or pipes, included in the drawing A1, drawing B1, and drawing C1, the relationship between elements, and the like and integrates these without duplication to generate the virtual plant VP1. In other words, the "virtual plant" is a collection of data indicating equipment, such as valves and pipes, in an actual plant, the relationship between pieces of equipment, and the like. The "virtual plant" may, for example, be described by a semantic data model or the like.

The first processing example is assumed to start at the point in time when the employee in charge B has used the terminal apparatus B to change the drawing B1, thereby creating a drawing B2, and to register the drawing B2 in the memory 12 of the drawing management apparatus 10. Control of access privileges, such as check-in/check-out, may be used so that while the employee in charge B is correcting the drawing B1, another employee in charge B' cannot correct the drawing B1.

In step S101, the processor 11 of the drawing management apparatus 10 acquires the drawings B1 and B2, which are the same type of drawing, from the memory 12 and compares the drawings B1 and B2. In the first processing example, the drawing B1 corresponds to an old version of a first type of drawing, and the drawing B2 corresponds to a new version of the first type of drawing.

In step S102, the processor 11 of the drawing management apparatus 10 judges whether a difference ΔB exists between the drawings B1 and B2. For example, the drawings B1 and B2 are the same type of drawing with the same or similar elements and expressions. The processor 11 can therefore make the judgment in step S102 using any appropriate image analysis technique, but this example is not limiting. For example, the processor 11 may make the judgment of step S102 after converting the drawings B1 and B2 to any appropriate comparison model or the like including information indicating the elements and the relationship between the elements. When the difference ΔB exists (step S102: YES), the processing proceeds to step S103. When no difference ΔB exists (step S102: NO), the present processing ends. However, when no difference ΔB exists, the processor 11 may, via the communication interface 13, notify the terminal apparatus B that no difference ΔB exists. The party involved with the drawing B can thereby recognize that the drawing B has been newly registered while confirming that no changes are included in the registered drawing B. No difference ΔB could exist when only the revised edition number of the drawing B has been updated. Recognizing this enables parties involved with the drawing B to learn that the revised edition has no changes and to pay greater attention. This can also prevent unnecessary notifications from being sent to the parties involved with other types of drawings.

In the case of proceeding from step S102 to step S103, the processor 11 of the drawing management apparatus 10 reflects the difference ΔB in the virtual plant VP1, acquired from the memory 12, in step S103. In this way, the virtual plant VP1 is updated to the virtual plant VP2. The processor 11 stores information related to the changes made to the virtual plant VP2 by updating in the memory 12. This information can include information such as the content of the update or the update time.

In step S104, the processor 11 of the drawing management apparatus 10 notifies a predetermined recipient, such as the terminal apparatus A, the terminal apparatus B, or the terminal apparatus C, of information related to the changes to the virtual plant VP2 via the communication interface 13. For example, the employee in charge A that receives the notification via the terminal apparatus A recognizes the new changes and uses the terminal apparatus A to create a drawing A2 reflecting the necessary changes, among the new changes, in the drawing A1 and register the drawing A2 in the memory 12 of the drawing management apparatus 10. In the first processing example, the drawings A1 and A2 correspond to a second type of drawing. The processor 11 may automatically provide the notification of step S104 via the communication interface 13 when updating the virtual plant VP2. Alternatively, the processor 11 may provide notification, via the communication interface 13, of a message containing a link (such as a URL) to the virtual plant VP stored in the memory 12 of the drawing management apparatus 10. In this case, the employee in charge or the like who receives notification of the message can click on the link to access the virtual plant VP stored in the memory 12 of the drawing management apparatus 10.

According to the first processing example, consistency between various types of drawings, and hence consistency between the drawings and an actual plant, can be secured. The case of updating the virtual plant VP1 due to a change to the drawing B1 has been described in the first processing example, but similar processing may be performed in the case of a change to the drawing A1 or C1.

Second Processing Example

Figure 3:
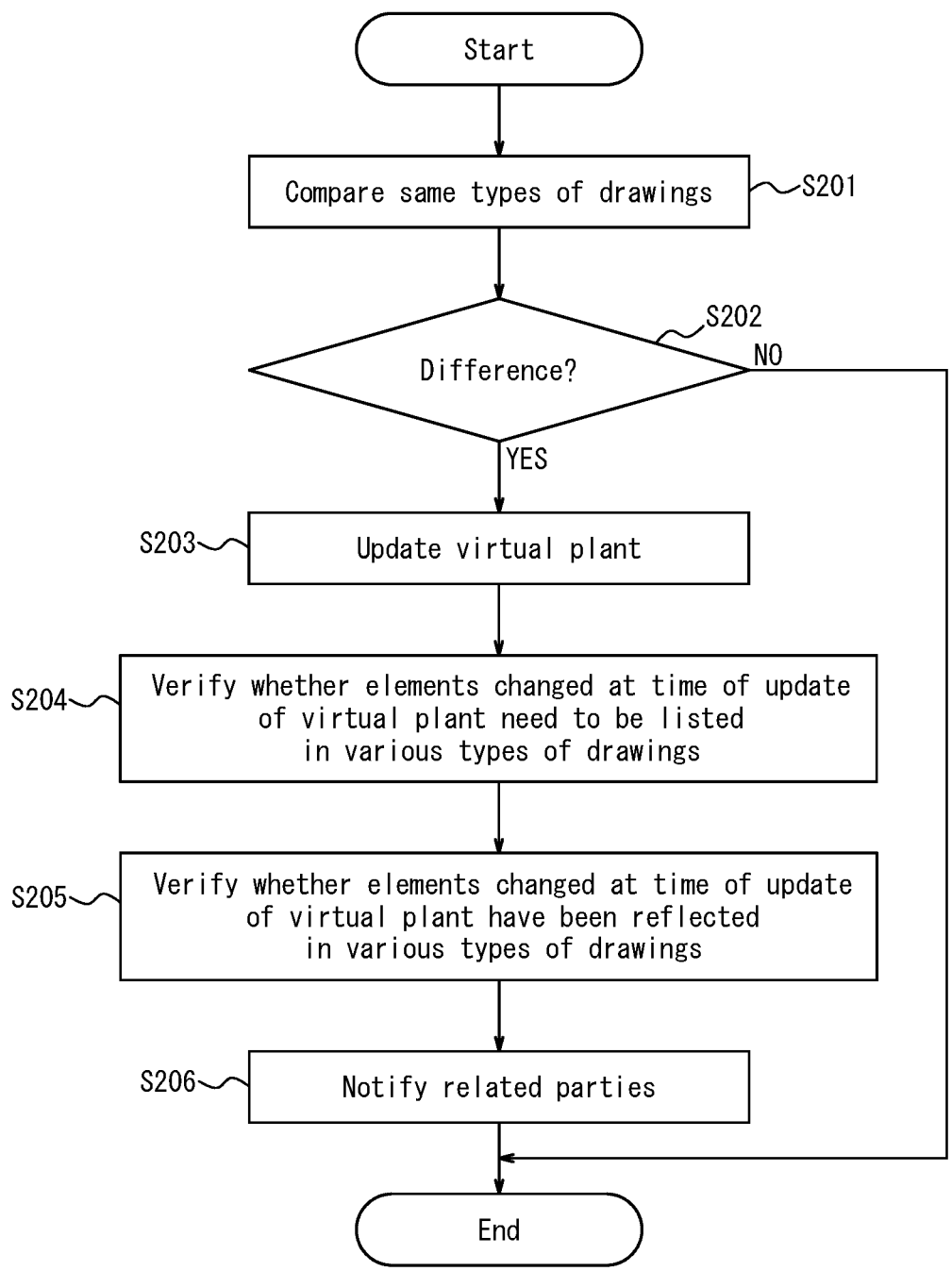
FIG. 3 is a flowchart illustrating a second processing example in the drawing management system according to an embodiment.

A second processing example of the drawing management system 1 according to the present embodiment is described with reference to FIGS. 3 through 5. The second processing example corresponds to an embodiment of a drawing management method according to the present disclosure.

When the types of drawings differ, the elements included in the drawings also differ, and the information amount differs. For example, the information amount increases in the order of PFD, P & ID, and 3D piping diagram. In particular, the information amount is extremely small in a PFD. Even when changes are made to a P & ID, for example, the changes might not need to be reflected in the PFD. Specifically, suppose that a manual valve is added in a P & ID. Since manual valves are not depicted in the PFD, it is meaningless for the employee in charge A of the PFD to be notified of the addition of a manual valve. Also, a certain employee or team may be in charge of a plurality of drawings, or a plurality of employees in charge of drawings may cooperate. In these cases, the changes to a certain type of drawing may have already been reflected in another type of drawing. These points are taken into consideration in the second processing example.

First, a drawing A1 created by employee in charge A, a drawing B1 created by employee in charge B, and a drawing C1 created by employee in charge C are assumed to be registered in advance in the memory 12 of the drawing management apparatus 10. The drawing A1, drawing B1, and drawing C1 may be registered in any order, and the types of the drawing A1, drawing B1, and drawing C1 are not limited to PFD, P & ID, and 3D piping diagram. The processor 11 of the drawing management apparatus 10 generates a virtual plant VP1 based on the drawing A1, drawing B1, and drawing C1 and stores the virtual plant VP1 in the memory 12, as in the first processing example.

The second processing example is assumed to start at the point in time when the employee in charge B has used the terminal apparatus B to change the drawing B1, thereby creating a drawing B2, and to register the drawing B2 in the memory 12 of the drawing management apparatus 10. In the present example, the change from the drawing B1 to the drawing B2 is the addition of a manual valve (M-Valve) MV501 and a control valve (C-Valve) CV203.

In step S201, the processor 11 of the drawing management apparatus 10 acquires the drawings B1 and B2, which are the same type of drawing, from the memory 12 and compares the drawings B1 and B2. In the second processing example, the drawing B1 corresponds to an old version of the first type of drawing, and the drawing B2 corresponds to a new version of the first type of drawing.

In step S202, the processor 11 of the drawing management apparatus 10 judges whether a difference ΔB exists between the drawings B1 and B2, as in step S102. When the difference ΔB exists (step S202: YES), the processing proceeds to step S203. When no difference ΔB exists (step S202: NO), the present processing ends. In the present example, the difference ΔB corresponds to the addition of MV501 and CV203.

In the case of proceeding from step S202 to step S203, the processor 11 of the drawing management apparatus 10 reflects the difference ΔB in the virtual plant VP1, acquired from the memory 12, in step S203. In this way, the virtual plant VP1 is changed to the virtual plant VP2. In the present example, the virtual plant VP2 is the result of adding MV 501 and CV 203 to the virtual plant VP1. In other words, the virtual plant VP2 is an update obtained by reflecting changes in the virtual plant VP1, which indicates the configuration of the actual plant up until that point, in response to changes such as the addition or deletion of elements in the various types of drawings. The various types of drawings are used in design of the plant. The content of the changes to the various types of drawings is ultimately reflected in the actual plant. When the content of the changes is accurately reflected by workers or the like, the various types of drawings and the actual plant match. Before the design content depicted in the various types of drawings is reflected in the actual plant, however, the virtual plant VP is data (an image of the future plant) integrating a group of drawings used for plant design. The virtual plant VP and the actual plant do not completely match.

FIG. 4 illustrates an example of a data table that includes information related to whether an element, such as a main instrument, configuring the virtual plants VP1, VP2 is an element needing to be listed in each drawing. In FIG. 4, an "O" indicates a necessary element. An "X" indicates an unnecessary element. The data table illustrated in FIG. 4 is stored in the memory 12 of the drawing management apparatus 10 and is referred to as necessary by the processor 11. According to the data table illustrated in FIG. 4, control valve, for example, is an element needing to be listed in all three of the PFD, P & ID, and 3D piping diagram. A manual valve, on the other hand, is an element not needing to be listed in the PFD but needing to be listed in the P & ID and the 3D piping diagram. In step S204, the processor 11 of the drawing management apparatus 10 therefore refers to the data table illustrated in FIG. 4 and verifies, for the drawing A1, the drawing B2, and the drawing C1, whether an element changed at a time of updating of the virtual plant VP2 is an element needing to be listed in the various types of drawings at the time of updating of the virtual plant VP2. The processor 11 includes the result of verification in the information related to the change made to the virtual plant VP2. Alternatively, the updating from the virtual plant VP1 to the virtual plant VP2 may be triggered by the change from the drawing B1 to the drawing B2. Accordingly, the processor 11 may perform the verification of step S204 on the drawings other than the drawing B2, i.e. the drawing A1 and the drawing C1. The verification of step S204 is therefore made even more efficient. In the present example, the processor 11 obtains verification results that MV501 is an element not needing to be listed in the drawing A1 but needing to be listed in the drawing C1, whereas CV203 is an element needing to be listed in the drawing A1 and the drawing C1.

In step S205, the processor 11 of the drawing management apparatus 10 verifies, for the drawing A1, the drawing B2, and the drawing C1, whether an element verified in step S204 as being an element needing to be listed in the various types of drawing, from among the elements changed at the time of updating of the virtual plant VP2, has been reflected in the various types of drawings. The processor 11 includes the result of verification in the information related to the change made to the virtual plant VP2. Alternatively, the updating from the virtual plant VP1 to the virtual plant VP2 may be triggered by the change from the drawing B1 to the drawing B2. Accordingly, the processor 11 may perform the verification of step S205 on the drawings other than the drawing B2, i.e. the drawing A1 and the drawing C1. The verification of step S205 is therefore made even more efficient. In the present example, the processor 11 obtains verification results that MV501 has not been reflected in the drawing C1, whereas CV203 has been reflected in the drawing A1 but not in the drawing C1.

In step S206, the processor 11 of the drawing management apparatus 10 notifies a predetermined recipient, such as the terminal apparatus A, the terminal apparatus B, or the terminal apparatus C, of information related to the change to the virtual plant VP2 via the communication interface 13. In the present example, the processor 11 notifies a predetermined recipient, such as the terminal apparatus A, the terminal apparatus B, or the terminal apparatus C, of information related to the change to the virtual plant VP2 via the communication interface 13 in list form, as illustrated in FIG. 5. In FIG. 5, a "check mark" indicates that an element has been reflected. An "X" indicates a non-reflected element. A "–" indicates an unnecessary element. A star indicates that the drawing triggered the VP update. The notation (symbols) are only non-limiting examples. With a notification such as the one illustrated in FIG. 5, each employee in charge who receives the notification via the terminal apparatus can confirm (1) information related to updating from the virtual plant VP1 to the virtual plant VP2, (2) information related to whether elements forming the virtual plant VP2 are elements needing to be listed in the various types of drawing, (3) information related to whether the elements forming the virtual plant VP2 have been reflected in the various types of drawings, (4) the drawing that served as a trigger for updating the virtual plant VP1 to the virtual plant VP2, and the like. In the present example, the employee in charge A who received a notification via the terminal apparatus A can confirm that (1) MV501 and CV203 were added to the virtual plant VP1, (2) MV501 is an element not needing to be listed in the drawing A1, whereas CV203 is an element needing to be listed in the drawing A1, (3) CV203 has been reflected in the drawing A1, and (4) the drawing that served as a trigger for updating the virtual plant VP1 to the virtual plant VP2 is the drawing B. In this case, the employee in charge A need not update the drawing A1. The employee in charge C who received a notification via the terminal apparatus C, on the other hand, can confirm that (1) MV501 and CV203 were added to the virtual plant VP1, (2) MV501 and CV203 are elements needing to be listed in the drawing C1, (3) MV501 and CV203 have not been reflected in the drawing C1, and (4) the drawing that served as a trigger for updating the virtual plant VP1 to the virtual plant VP2 is the drawing B. In this case, the employee in charge C uses the terminal apparatus C to create a drawing C2 by adding MV501 and CV203 to the drawing C1 and register the drawing C2 in the memory 12 of the drawing management apparatus 10. The format of the notification, however, is not limited to the list format illustrated in FIG. 5 and can be appropriately changed in accordance with the object of notification or the purpose. In the second processing example, the drawing A1 corresponds to the second type of drawing, and the drawings C1 and C2 correspond to a third type of drawing.

In step S206, the processor 11 of the drawing management apparatus 10 may provide notification to all of the parties involved, via the communication interface 13, of information related to the change to the virtual plant VP2 or provide notification of only information necessary for the employee in charge of each type of drawing. For example, among information related to the change to the virtual plant VP2, the processor 11 may notify the employee in charge of the drawing A, via the communication interface 13, only of whether a change is necessary in the drawing A. As another example, the processor 11 may notify the employee in charge of the drawing C or the like, via the communication interface 13, that an element has not been reflected in the drawing C only when a symbol (such as "x") is attached to indicate that an element has not been reflected in the drawing C, for example, among the elements changed at the time of updating to the virtual plant VP2, as illustrated in FIG. 5. Alternatively, when a predetermined time has elapsed since updating of the virtual plant VP, or when the amount of information to be reflected in the various types of drawings due to updating of the virtual plant VP exceeds a predetermined threshold, the processor 11 may notify each terminal apparatus, via the communication interface 13, of information related to changes made to the virtual plant VP. The "predetermined time" and the "predetermined threshold" are appropriately set by each employee in charge. Each employee in charge can thereby appropriately set the frequency of operations associated with the notification. This configuration is useful for preventing each employee in charge from feeling annoyed by individual notifications of small changes and for preventing work from becoming inefficient.

According to the second processing example, each employee can efficiently learn whether, due to updating of the virtual plant VP, changes need to be made to the drawings of which the employee is in charge. The efficiency of work to change the drawings therefore increases. The case of updating the virtual plant VP1 due to a change to the drawing B1 has been described in the second processing example, but similar processing may be performed in the case of a change to the drawing A1 or C1.

The present disclosure is based on drawings and embodiments, but it should be noted that a person of ordinary skill in the art could make a variety of changes or modifications based on the present disclosure. Therefore, such changes and modifications are to be understood as included within the scope of the present disclosure. For example, the functions and the like included in the various steps and the like may be reordered in any logically consistent way. Furthermore, a plurality of steps or the like may be combined into one, or a single step or the like may be divided.

For example, in the above-described processing example, each employee in charge may access the drawing management apparatus 10 using the corresponding terminal apparatus at any appropriate timing to confirm the latest state of the virtual plant VP.

In the above-described processing example, notification of the information related to changes made to the virtual plant VP is provided to the employee in charge A, B, or C in the list format illustrated in FIG. 5. Many different types of elements form the virtual plant VP, however, and the work efficiency would therefore improve if the employee in charge A, B, or C were notified of information related to changes made to the virtual plant VP after the information was filtered. As a modification, the processor 11 of the drawing management apparatus 10 therefore filters the information related to changes made to the virtual plant VP based on a filtering condition acquired via the communication interface 13 from the terminal apparatus A, B, or C, for example. Subsequently, the processor 11 of the drawing management apparatus 10 notifies the terminal apparatus A, B, or C, via the communication interface 13, of the filtered information related to changes made to the virtual plant VP. The "filtering condition" may be (1) the current state of a particular element, such as a valve or a pipe, in the employee's drawing, (2) whether elements need to be reflected, due to the change to the virtual plant, in the employee's drawing, (3) the current state of a drawing other than the employee's drawing (in particular, a drawing that the employee is not in charge of but that is strongly associated with the employee's drawing), (4) the current state of the virtual plant overall, or a combination of these. In particular, (3) is useful for a supervisor or the like who oversees the entire plant. The filtering condition is appropriately set by the employee in charge A, B, or C using the terminal apparatus A, B, or C, for example.

In the above-described processing example, on-site workers or the like might not fully refer to the drawings or might not completely follow the drawings when exchanging or repairing plant components. To address this issue, a 3D scanning apparatus or the like capable of imaging the outline of the actual plant may be used to learn the current state of the actual plant. The processor 11 of the drawing management apparatus 10 may update the virtual plant VP based on a comparison between a 3D piping diagram created from the 3D scan data of the actual plant imaged by the 3D scanning apparatus or the like and the 3D piping diagram already created based on the PFD, the P & ID, or the like. This leads to an understanding of the state of the actual plant, such as which devices or the like were installed among the devices or the like added to or deleted from the various types of drawings, and how these devices or the like were installed or removed, due to changes in the various types of drawings. The virtual plant VP is then updated in accordance with the state of the actual plant. The consistency between the various types of drawings and the actual plant can therefore be further improved. The information related to changes made to the virtual plant VP may include a creation history or the like of the various types of drawings.

INDUSTRIAL APPLICABILITY

According to the present disclosure, a drawing management apparatus, a drawing management system, and a drawing management method capable of securing consistency between various types of drawings, and hence consistency between the drawings and an actual plant, can be provided.

The invention claimed is:

1. A drawing management apparatus comprising:
a processor; and
a communication interface;
wherein the processor is configured to:
  generate a virtual plant based on various types of drawings of a plant;
  update the virtual plant, when a change is made to a content of a first type of drawing among the various types of drawings, based on the content of the change to the first type of drawing; and
  notify, when an element changed in the first type of drawing is necessary in a second type of drawing among the various types of drawings and has not been reflected in the second type of drawing, a predetermined recipient in charge of the second type of drawing, via the communication interface, of information related to a content of a change made to the virtual plant by updating.

2. The drawing management apparatus of claim 1, wherein the processor is configured to perform verification of whether an element changed at a time of updating of the virtual plant is an element needing to be listed in the various types of drawings at the time of updating and include a result of the verification in the information related to the change made to the virtual plant by updating.

3. The drawing management apparatus of claim 2, wherein the processor is configured to perform verification of whether an element changed at a time of updating of the virtual plant is reflected in the various types of drawings at the time of updating and include a result of the verification in the information related to the change made to the virtual plant by updating.

4. The drawing management apparatus of claim 3, wherein the processor is configured to perform the verification on various types of drawings other than the drawing changed at the time of updating.

5. The drawing management apparatus of claim 2, wherein the processor is configured to perform the verification on various types of drawings other than the drawing changed at the time of updating.

6. The drawing management apparatus of claim 1, wherein the processor is configured to perform verification of whether an element changed at a time of updating of the virtual plant is reflected in the various types of drawings at the time of updating and include a result of the verification in the information related to the change made to the virtual plant by updating.

7. The drawing management apparatus of claim 6, wherein the processor is configured to perform the verification on various types of drawings other than the drawing changed at the time of updating.

8. The drawing management apparatus of claim 1, wherein the various types of drawings include design drawings specifying elements of an actual plant and a relationship between the elements of the actual plant, and
wherein the virtual plant corresponds to data virtually indicating equipment in the actual plant and a relationship between the equipment in the actual plant.

9. The drawing management apparatus of claim 1, wherein the various types of drawings are changeable from a terminal apparatus, and
wherein the virtual plant cannot be directly changed from the terminal apparatus.

10. The drawing management apparatus of claim 9, wherein the virtual plant is described by a semantic data model that indicates equipment in an actual plant and the relationship between pieces of equipment.

11. The drawing management apparatus of claim 10, wherein the processor is further configured to update the virtual plant based on a comparison between a drawing created from data of an actual plant and the various types of drawings.

12. A drawing management system comprising:
the drawing management apparatus of claim 1; and
at least one terminal apparatus capable of communicating with the drawing management apparatus.

13. A drawing management system comprising:
the drawing management apparatus of claim 2; and
at least one terminal apparatus capable of communicating with the drawing management apparatus.

14. A drawing management system comprising:
the drawing management apparatus of claim 6; and
at least one terminal apparatus capable of communicating with the drawing management apparatus.

15. A drawing management system comprising:
the drawing management apparatus of claim 3; and
at least one terminal apparatus capable of communicating with the drawing management apparatus.

16. A drawing management system comprising:
the drawing management apparatus of claim 5; and
at least one terminal apparatus capable of communicating with the drawing management apparatus.

17. A drawing management system comprising:
the drawing management apparatus of claim 7; and
at least one terminal apparatus capable of communicating with the drawing management apparatus.

18. A drawing management system comprising:
the drawing management apparatus of claim 4; and
at least one terminal apparatus capable of communicating with the drawing management apparatus.

19. A drawing management method using a computer, the drawing management method comprising:
generating a virtual plant based on various types of drawings of a plant;
updating the virtual plant, when a change is made to a content of a first type of drawing among the various types of drawings, based on the content of the change to the first type of drawing; and
notifying, when an element changed in the first type of drawing is necessary in a second type of drawing among the various types of drawings and has not been reflected in the second type of drawing, a predetermined recipient in charge of the second type of drawing of information related to a content of a change made to the virtual plant by updating.

\* \* \* \* \*